(12) United States Patent
Kim et al.

(10) Patent No.: US 9,653,522 B2
(45) Date of Patent: May 16, 2017

(54) ORGANIC LIGHT-EMITTING DIODE DISPLAY APPARATUS INCLUDING A PHOTO SENSOR

(71) Applicant: SAMSUNG DISPLAY CO., LTD., Yongin-si, Gyeonggi-Do (KR)

(72) Inventors: Daewoo Kim, Yongin-si (KR); Jonghyun Park, Yongin-si (KR)

(73) Assignee: SAMSUNG DISPLAY CO., LTD., Yongin-si, Gyeonggi-Do (KR)

(*) Notice: Subject to any disclaimer, the term of this patent is extended or adjusted under 35 U.S.C. 154(b) by 0 days.

(21) Appl. No.: 15/084,301

(22) Filed: Mar. 29, 2016

(65) Prior Publication Data
US 2017/0012086 A1    Jan. 12, 2017

(30) Foreign Application Priority Data

Jul. 6, 2015  (KR) .................. 10-2015-0096073

(51) Int. Cl.
*H01L 51/00*    (2006.01)
*H01L 27/32*    (2006.01)
*H01L 51/52*    (2006.01)

(52) U.S. Cl.
CPC ...... *H01L 27/3227* (2013.01); *H01L 27/3248* (2013.01); *H01L 27/3258* (2013.01); *H01L 27/3262* (2013.01); *H01L 51/5218* (2013.01); *H01L 51/5271* (2013.01); *H01L 51/006* (2013.01); *H01L 51/0035* (2013.01);
(Continued)

(58) Field of Classification Search
CPC ............ H01L 27/3227; H01L 27/3262; H01L 27/3258; H01L 27/3248; H01L 51/5218; H01L 51/5271; H01L 51/0078; H01L 51/006; H01L 51/0058; H01L 51/0081; H01L 51/0037; H01L 51/0035; H01L 51/0038; H01L 51/0039
See application file for complete search history.

(56) References Cited

U.S. PATENT DOCUMENTS

2007/0176177 A1    8/2007  Jung et al.
2008/0122819 A1*   5/2008  Cho ................. G09G 3/3233
                                                      345/205
(Continued)

FOREIGN PATENT DOCUMENTS

JP    2010-078853    4/2010
JP    2010-141784    6/2010
(Continued)

*Primary Examiner* — Nicholas Tobergte
(74) *Attorney, Agent, or Firm* — F. Chau & Associates, LLC

(57) ABSTRACT

An organic light-emitting diode display apparatus includes a substrate. An organic light-emitting device is disposed on the substrate and includes a first electrode, a second electrode, and an emission layer disposed between the first electrode and the second electrode. A reflectance of the first electrode is greater than a reflectance of the second electrode. A thin-film transistor is disposed between the substrate and the first electrode and is connected to the first electrode. A first light reflective layer is connected to the thin-film transistor that is disposed between the substrate and the first electrode. A photo sensor is disposed in an outer area of the substrate and is configured to sense light reflected from the first light reflective layer.

21 Claims, 17 Drawing Sheets

(52) U.S. Cl.
CPC ...... *H01L 51/0037* (2013.01); *H01L 51/0038* (2013.01); *H01L 51/0039* (2013.01); *H01L 51/0058* (2013.01); *H01L 51/0078* (2013.01); *H01L 51/0081* (2013.01)

(56) References Cited

U.S. PATENT DOCUMENTS

| | | | |
|---|---|---|---|
| 2009/0140973 A1* | 6/2009 | Kim | G09G 3/3413 345/102 |
| 2010/0117932 A1* | 5/2010 | Yamashita | G09G 3/3233 345/55 |
| 2011/0043502 A1* | 2/2011 | Yamashita | G09G 3/3233 345/207 |
| 2013/0175533 A1 | 7/2013 | Lee et al. | |
| 2016/0093251 A1* | 3/2016 | Chung | G01J 1/0403 345/207 |

FOREIGN PATENT DOCUMENTS

| | | |
|---|---|---|
| KR | 1020050027464 | 3/2005 |
| KR | 10-2007-0076860 | 7/2007 |
| KR | 10-2013-0080642 | 7/2013 |

\* cited by examiner

ORGANIC LIGHT-EMITTING DIODE DISPLAY APPARATUS INCLUDING A PHOTO SENSOR

CROSS-REFERENCE TO RELATED APPLICATION

This application claims priority to Korean Patent Application No. 10-2015-0096073, filed on Jul. 6, 2015, in the Korean Intellectual Property Office, the disclosure of which is herein incorporated by reference in its entirety.

TECHNICAL FIELD

The present invention relates to an organic light-emitting diode display apparatus, and more particularly, to an organic light-emitting diode display apparatus including a photo sensor.

DISCUSSION OF THE RELATED ART

An organic light-emitting diode (OLED) display apparatus is a type of display apparatus referred to as a self-emissive display apparatus as it does not require a separate light source, such as a backlight, to display an image. OLED display apparatuses generally includes a hole injection electrode, an electron injection electrode, and an emission layer formed between the hole injection electrode and the electron injection electrode. During operation of the OLED display apparatus, holes injected from the hole injection electrode and electrons injected from the electron injection electrode are re-combined in the emission layer so that light is emitted therefrom.

SUMMARY

Exemplary embodiments of the present invention include an OLED display apparatus having a high aperture ratio, a high yield rate, and a photo sensor with high efficiency disposed therein.

Additional aspects of the present invention will be set forth in the description which follows and the accompanying figures.

According to one or more exemplary embodiments of the present invention, an organic light-emitting diode (OLED) display apparatus includes a substrate. An organic light-emitting device is disposed on the substrate and includes a first electrode, a second electrode, and an emission layer between the first electrode and the second electrode. A reflectance of the first electrode is greater than a reflectance of the second electrode. A thin-film transistor is disposed between the substrate and the first electrode and is connected to the first electrode. A first light reflective layer is disposed between the substrate and the first electrode and is connected to the thin-film transistor that is connected to the first electrode. A photo sensor is disposed in an outer area of the substrate and is configured to sense light reflected from the first light reflective layer.

The first light reflective layer may overlap the first electrode in a vertical direction with respect to the substrate.

The first light reflective layer may have an area that is between about 50% and about 100% of an area of the first electrode.

The thin-film transistor may include an active layer, a gate electrode, a source electrode, and a drain electrode. The first light reflective layer may be disposed on a same layer as the gate electrode.

The first light reflective layer may include a same material as the gate electrode.

An organic insulating layer may be disposed between the source and drain electrodes and the first electrode, and the first electrode may directly contact one of the source and drain electrodes though a via hole formed in the organic insulating layer.

The thin-film transistor may include an active layer, a gate electrode, a source electrode, and a drain electrode. The first light reflective layer may be disposed on a same layer as the source electrode and the drain electrode.

The first light reflective layer may include a same material as each of the source electrode and the drain electrode.

An organic insulating layer may be disposed between the source and drain electrodes and the first electrode and may be disposed between the first light reflective layer and the first electrode. The first electrode may directly contact one of the source and drain electrodes through a via hole formed in the organic insulating layer.

The organic light-emitting diode display apparatus may further include a second light reflective layer disposed between the first light reflective layer and the first electrode.

The thin-film transistor may include an active layer, a gate electrode, a source electrode, and a drain electrode. The first light reflective layer may be disposed on a same layer as the gate electrode, and the second light reflective layer may be disposed on a same layer as the source electrode and the drain electrode.

The first light reflective layer may include a same material as the gate electrode, and the second light reflective layer may include a same material as each of the source electrode and the drain electrode.

An organic insulating layer may be disposed between the source and drain electrodes and the first electrode and may be disposed between the second light reflective layer and the first electrode. The first electrode may directly contact one of the source and drain electrodes though a via hole formed in the organic insulating layer.

The second light reflective layer may electrically float with respect to the first electrode and the thin-film transistor.

The second light reflective layer may overlap the first electrode in a vertical direction with respect to the substrate.

The second light reflective layer may have an area that is less than an area of the first light reflective layer.

The first electrode may include silver (Ag) or a silver alloy.

According to one or more exemplary embodiments of the present invention, an OLED display apparatus includes a display area on a substrate. The display area includes a plurality of pixels disposed on the display area. Each of the plurality of pixels includes a first electrode, a second electrode having a reflectance less than a reflectance of the first electrode, and an emission layer between the first electrode and the second electrode. A driving thin-film transistor is disposed between the substrate and the first electrode, and is connected to the first electrode. A first light reflective layer is connected to the driving thin-film transistor that is disposed between the substrate and the first electrode and is connected to the first electrode. The organic light-emitting diode display apparatus further includes a photo sensor that is disposed in an outer area of the display area and is configured to sense light reflected from a plurality of the first light reflective layers included in the plurality of pixels.

Each of the plurality of pixels may emit light of a different color, and the photo sensor may include a plurality of photo devices configured to sense the light of the different color.

White light may be generated when the respective lights of different colors emitted from the plurality of pixels are mixed.

The photo sensor may be disposed at a side end of the substrate.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Figure 1:
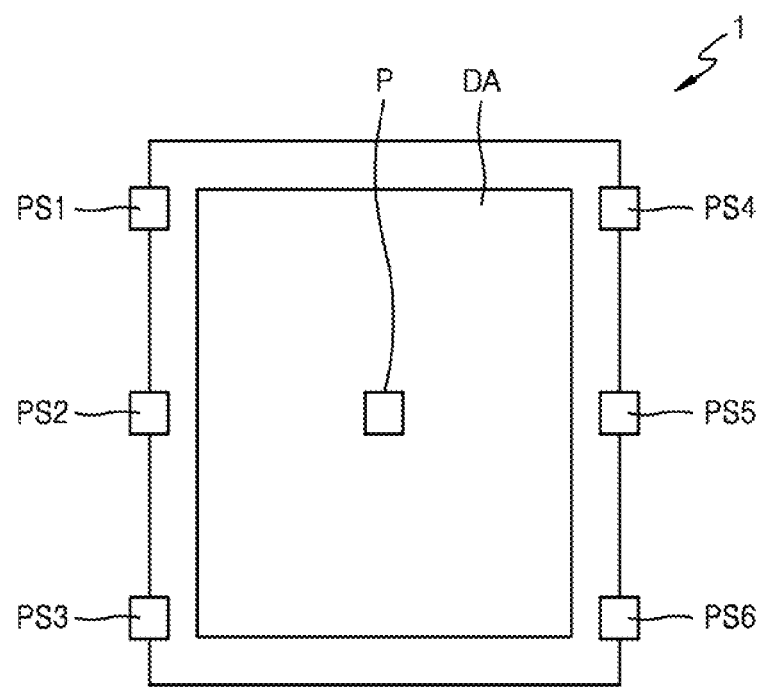
FIG. 1 is a plan view illustrating an organic light-emitting diode display apparatus according to an exemplary embodiment of the present invention.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

Hereinafter, one or more exemplary embodiments of the present invention will be described in more detail with reference to the accompanying drawings. Like reference numerals may represent identical or similar components within the several drawings.

It will also be understood that when an element such as layer, region, or component is referred to as being "on" another element, it can be directly on the other element, or intervening elements such as layer, region, or component may also be interposed therebetween.

In the drawings, for convenience of description, the sizes of layers and regions may be exaggerated for clarity.

Figure 2:
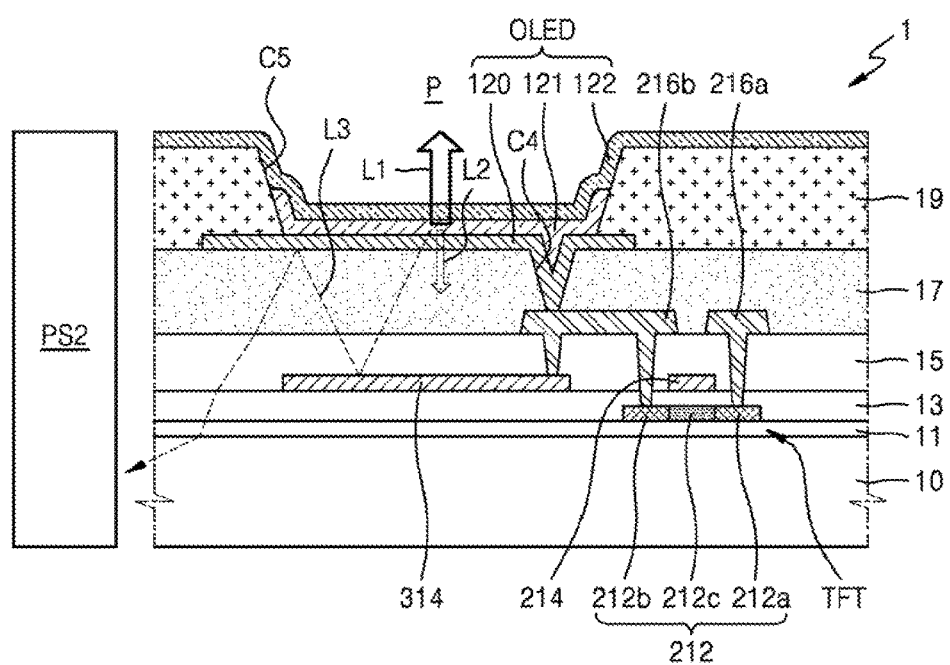
FIG. 2 is a cross-sectional view illustrating portions of a pixel and a photo sensor of the OLED display apparatus according to an exemplary embodiment of the present invention.

FIG. 1 is a plan view of an organic light-emitting diode (OLED) display apparatus 1 according to an exemplary embodiment of the present invention. FIG. 2 is a cross-sectional view illustrating portions of a pixel and a photo sensor of the OLED display apparatus 1 according to an exemplary embodiment of the present invention.

Referring to FIG. 1, a display area DA including a plurality of pixels P is formed on a substrate 10. A plurality of photo sensors PS1 through PS6 are disposed in an outer area of the display area DA. The photo sensors O1 through P6 sense a portion of light emitted from each pixel P.

The plurality of photo sensors PS1 through PS6 sense a portion of light emitted from each pixel P. When the organic light-emitting diode display apparatus 1 is driven for a long time, an emission layer of each pixel P may deteriorate such that spots may occur in the display area DA. The organic light-emitting diode display apparatus 1 including the photo sensors PS1 through PS6 may recognize a level of deterioration of a pixel P based on data about the amount of light sensed by the photo sensors PS1 through PS6 and may correct an irregular luminance of the pixel P by using an appropriate correction system, and thus, the occurrence of spots may be decreased.

For convenience of description, FIG. 1 shows 6 photo sensors PS1 through PS6 disposed in the outer area of the display area DA. However, exemplary embodiments of the present invention are not limited to this particular arrangement and more photo sensors than the photo sensors PS1 through PS6 shown in FIG. 1 may be disposed and locations of the photo sensors PS1 through PS6 may vary in the outer area of the display area DA.

Referring to FIG. 2, a thin-film transistor TFT, a first light reflective layer 314, and an organic light-emitting device OLED are disposed on the substrate 10 in the pixel P, and the photo sensor PS2 is disposed in an outer area of the substrate 10.

The substrate 10 may include a glass substrate or a plastic substrate including polyethylene terephthalate (PET), polyethylene naphthalate (PEN), polyimide, or the like.

A buffer layer 11 may be further disposed on the substrate 10 so as to form a planar surface on the substrate 10 and to prevent penetration of foreign substances therethrough. The buffer layer 11 may be formed as a single layer or multiple layers including a silicon nitride layer and/or a silicon oxide layer.

An active layer 212 is disposed on the buffer layer 11. The active layer 212 may be formed of a semiconductor including amorphous silicon or polysilicon. The active layer 212 may include a channel region $212c$, a source region $212a$ and a drain region $212b$. The source and drain regions $212a$ and $212b$ are disposed at opposite sides of the channel region $212c$ and are doped with an impurity. A material of the active layer 212 is not limited to amorphous silicon or polysilicon and, for example, may include an oxide semiconductor.

A gate insulating layer 13 is disposed on the active layer 212. The gate insulating layer 13 may be formed as a single layer or multiple layers including a silicon nitride layer and/or a silicon oxide layer.

A gate electrode 214 is disposed on the gate insulating layer 13. The gate electrode 214 may be formed as a single layer or multiple layers including aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu).

Although not illustrated in FIG. 2, a wiring such as a scan line may be formed from the same material layer as the gate electrode 214.

An interlayer insulating layer 15 is deposited on the gate electrode 214. The interlayer insulating layer 15 may be formed as a single layer or multiple layers including a silicon nitride layer and/or a silicon oxide layer.

A source electrode 216a and a drain electrode 216b are disposed on the interlayer insulating layer 15. Each of the source electrode 216a and the drain electrode 216b may be formed as a single layer or multiple layers including Al, Pt, Pd, Ag, Mg, Au, Ni, Nd, Ir, Cr, Li, Ca, Mo, Ti, W, Cu, and/or an alloy thereof.

A first organic insulating layer 17 that covers the source electrode 216a and the drain electrode 216b is disposed on the source electrode 216a and the drain electrode 216b. The first organic insulating layer 17 may include an acryl-based polymer, an imide-based polymer, an allyl ether-based polymer, an amide-based polymer, a fluorine-based polymer, a p-xylene-based polymer, a vinyl alcohol-based polymer, polymer derivatives having a phenol group, or a combination thereof.

The first organic insulating layer 17 may planarize a top surface of an insulating layer that covers the source electrode 216a and the drain electrode 216b. When a first electrode 120 (described in detail below) is formed on the planar top surface of the first organic insulating layer 17, it is possible to prevent luminance irregularity of a display apparatus which is caused due to an irregular surface of the pixel electrode 120.

A via hole C4 is formed in the first organic insulating layer 17, and the first electrode 120 of the organic light-emitting diode (OLED) device is connected to one of the source electrode 216a and the drain electrode 216b of the thin-film transistor TFT via the via hole C4. As shown in FIG. 2, the first electrode 120 is connected to the drain electrode 216b, however the first electrode 120 may alternatively
be connected to the source electrode 216a.

Although not illustrated in FIG. 2, a data wiring, a VDD wiring, or the like may be further formed from the same material layer as the source electrode 216a and the drain electrode 216b.

A reflectance of the first electrode 120 may be greater than a reflectance of a second electrode 122.

The first electrode 120 may include a material having a greater reflectance than that of the second electrode 122. For example, the first electrode 120 may include silver (Ag) or a silver alloy. When the first electrode 120 includes silver (Ag) or the silver alloy, a first transparent conductive oxide layer (not shown) may be further formed between the first electrode 120 and the first organic insulating layer 17 so as to increase adhesion between the first organic insulating layer 17 and the first electrode 120. A second transparent conductive oxide layer (not shown) may be further formed between the first electrode 120 and an emission layer 121 so as to protect the first electrode 120. Each of the first and second transparent conductive oxide layers may include indium tin oxide (ITO), indium zinc oxide (IZO), zinc oxide (ZnO), indium oxide ($In_2O_3$), indium gallium oxide (IGO), and/or aluminum zinc oxide (AZO).

An opening C5 is formed in a second organic insulating layer 19 so as to expose a top surface of the first electrode 120, and the second organic insulating layer 19 covers end portions of the first electrode 120. The second organic insulating layer 19 may function as a pixel-defining layer that defines an emission area of a pixel.

The second organic insulating layer 19 may include an acryl-based polymer, an imide-based polymer, an allyl ether-based polymer, an amide-based polymer, a fluorine-based polymer, a p-xylene-based polymer, a vinyl alcohol-based polymer, polymer derivatives having a phenol group, or a combination thereof.

The emission layer 121 is formed in the opening C5 in the second organic insulating layer 19. The emission layer 121 may include a small molecule organic material or a polymer organic material.

If the emission layer 121 includes the small molecule organic material, a hole transport layer (HTL), a hole injection layer (HIL), an electron transport layer (ETL), or an electron injection layer (EIL) may be further included between the first electrode 120 and the second electrode 122. In addition to these layers, where desired, various layers may be further included. For example, various organic materials including copper phthalocyanine (CuPc), N,N'-Di (naphthalene-1-yl)-N,N'-diphenyl-benzidine (NPB), tris-8-hydroxyquinoline aluminum)(Alq3), or the like may be used.

If the emission layer 121 includes the polymer organic material, an HTL may be further included between the first electrode 120 and the second electrode 122. The HTL may be formed of poly-(2,4)-ethylene-dihydroxy thiophene (PE-DOT) or polyaniline (PANI). For example, the polymer organic material may include poly-phenylene vinylene (PPV), polyfluorene, or the like.

An inorganic material may be further included between the first electrode 120 and the second electrode 122.

As shown in FIG. 2, the emission layer 121 is disposed in the opening C5. However, this configuration is shown only for convenience of description and one or more exemplary embodiments of the present invention are not limited to this particular arrangement. For example, the emission layer 121 may be formed not only in the opening C5 but may also extend to a top surface of the second organic insulating layer 19 along an etched surface of the opening C5.

The second electrode 122 is disposed on the emission layer 121. The reflectance of the second electrode 122 may be less than the reflectance of the first electrode 120. The second electrode 122 may include silver (Ag), magnesium (Mg), aluminum (Al), palladium (Pd), gold (Au), nickel (Ni), neodymium (Nd), iridium (Ir), chromium (Cr), lithium (Li), calcium (Ca), or a combination thereof.

Since the reflectance of the first electrode 120 is greater than the reflectance of the second electrode 122, a large portion of light L1 from among the amount of light emitted from the emission layer 121 is emitted in an opposite direction of the substrate 10, and only a small portion of light L2 from among the amount of light emitted from the emission layer 121 is emitted toward the substrate 10.

As such, an emission type in which light is emitted from the emission layer 121 in an opposite direction of the substrate 10, rather than toward the substrate 10, is referred to as a top emission type organic light-emitting diode display apparatus. On the other hand, an emission type in which light is further emitted from the emission layer 121 toward the substrate 10 is referred to as a bottom emission type organic light-emitting diode display apparatus. Since the bottom emission-type display apparatus might not have elements such as a thin-film transistor, a capacitor, a wiring, etc. that block a travel of light between the substrate 10 and the organic light-emitting diode (OLED) device which is a light emission path, it is structurally difficult for the bottom emission-type display apparatus to have an emission area. However, since the organic light-emitting diode display apparatus 1 according to exemplary embodiments of the present invention is the top emission type organic light-emitting diode display apparatus, various elements may be disposed between the substrate 10 and the organic light-emitting device OLED, so that an aperture ratio of the organic light-emitting diode display apparatus 1 may be increased compared to that of the bottom emission-type display apparatus.

In the organic light-emitting diode display apparatus 1 according to an exemplary embodiment of the present invention, the first electrode 120 is used as an anode and the second electrode 122 is used as a cathode, but polarities of the electrodes may be switched.

The photo sensors PS1 through PS6 (refer to FIG. 1) are disposed in the outer area of the display area DA, and in this regard, FIG. 2 illustrates the photo sensor PS2 from among the photo sensors PS1 through PS6. The photo sensor PS2 senses a portion of light emitted from the pixel P.

Light emitted from the emission layer 121 is discharged in front, rear-right, and rear-left directions, and a portion of the light is refracted and/or reflected at interfaces between insulating layers between the first electrode 120 and the substrate 10. Accordingly, a path of the light emitted from the emission layer 121 is changed. An insulating layer, that satisfies a total-reflection condition and is one of the insulating layers disposed between the first electrode 120 and the substrate 10, forms a waveguide, and the emitted light is guided along the waveguide.

Since a large portion of light is emitted toward the substrate 10 in a bottom emission-type display apparatus, the amount of the light guided along the substrate 10 is high so that the photo sensor PS2 may collect a sufficient amount of data about the amount of light. However, in the organic light-emitting diode display apparatus 1, a small amount of light is emitted toward the substrate 10, and thus, it is difficult to collect a sufficient amount of light.

According to exemplary embodiments of the present invention, the first light reflective layer 314 is disposed between the substrate 10 and the first electrode 120.

The first light reflective layer 314 is formed in such a manner that a portion of the first light reflective layer 314 overlaps with the first electrode 120 in a vertical direction with respect to the substrate 10. An area of the first light reflective layer 314 may be between about 50% and about 100% of an area of the first electrode 120. If the area of the first light reflective layer 314 is too small, a signal might not be detected by a liquid crystal display (LCD) modulator 40 (refer to FIG. 6A) in a TFT array test (described in detail below), and if the area of the first light reflective layer 314 is too large, a space for elements such as a thin-film transistor, a capacitor, etc. that are required to configure a pixel circuit may be insufficient.

A portion of light that is discharged from the emission layer 121 and is emitted toward the substrate 10 is reflected from the first light reflective layer 314, and a portion of reflected light is emitted toward the first electrode 120. The light emitted toward the first electrode 120 is reflected from the first electrode 120 and thus is emitted again toward the substrate 10. Light L3 that is emitted toward the substrate 10 and satisfies a total-reflection condition may be guided along the substrate 10 and may reach the photo sensor PS2. In this regard, not only the substrate 10 but also insulating layers such as the buffer layer 11, the gate insulating layer 13, the interlayer insulating layer 15, and the first organic insulating layer 17 that are disposed between the substrate 10 and the first electrode 120 may function as waveguides, and light guided along the insulating layers may reach the photo sensor PS2 therethrough.

Therefore, since the organic light-emitting diode display apparatus 1, according to exemplary embodiments of the present invention, includes the first light reflective layer 314, although the organic light-emitting diode display apparatus 1 is a top emission-type display apparatus, the amount of light that reaches the photo sensor PS2 is increased in the organic light-emitting diode display apparatus 1. The photo sensor PS2 may recognize a level of deterioration of the pixel P based on the collected data about the amount of light received, may correct an irregular luminance of the pixel P by using an appropriate correction system, and thus, the occurrence of spots may be decreased. Therefore, a display quality of the organic light-emitting diode display apparatus 1 may be increased.

According to exemplary embodiments of the present invention, the first light reflective layer 314 may be formed from the same material layer as the gate electrode 214. Therefore, the first light reflective layer 314 may be formed without an additional mask process.

According to exemplary embodiments of the present invention, the first light reflective layer 314 is electrically connected to the drain electrode 216b of the thin-film transistor TFT. The first light reflective layer 314 may function not only as the waveguide but may also facilitate a TFT array test and a repair with respect to a display apparatus (for example, the organic light-emitting diode display apparatus 1. Detailed descriptions thereof are provided below.

Although not illustrated in FIG. 2, the organic light-emitting diode display apparatus 1 according to an exemplary embodiment of the present invention may further include a switching transistor, a compensating transistor, or the like, as well as a driving transistor.

The organic light-emitting diode display apparatus 1 according to exemplary embodiments of the present invention may further include at least one capacitor (not shown). An electrode of the capacitor may be formed from the same material layer as the gate electrode 214, and another electrode of the capacitor may be formed from the same material layer as the source electrode 216a and the drain electrode 216b.

The organic light-emitting diode display apparatus 1 according to an exemplary embodiment of the present invention may further include an encapsulation member (not shown) that encapsulates the display area DA. The encapsulation member may be formed as a substrate including a glass material, a metal film, or an encapsulation thin film formed of an organic insulating film and an inorganic insulating film that are alternately stacked.

Hereinafter, a method of manufacturing an organic light-emitting diode display apparatus 1 will be described with reference to FIGS. 3A through 3G.

FIGS. 3A through 3G are cross-sectional views illustrating a method of manufacturing the organic light-emitting diode display apparatus 1 according to an exemplary embodiment of the present invention.

Figure 3A:
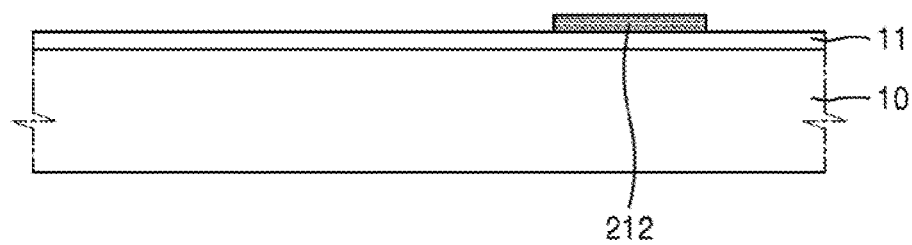
FIGS. 3A through 3G are cross-sectional views illustrating a method of manufacturing the OLED display apparatus according to an exemplary embodiment of the present invention.

FIG. 3A is a cross-sectional view illustrating a first process for the organic light-emitting diode display apparatus 1, according to an exemplary embodiment of the present invention.

Referring to FIG. 3A, the buffer layer 11 is formed on the substrate 10, and a semiconductor layer (not shown) is formed on the buffer layer 11 and is then patterned so as to form the active layer 212 of the thin-film transistor.

Although not illustrated, after photoresist (not shown) is coated on the semiconductor layer, the semiconductor layer is patterned via a photolithography process using a first photomask (not shown), so that the active layer 212 is formed. The first process using the photolithography process is processed via an exposure process, a developing process, an etching process, and a stripping or ashing process that are sequentially performed.

The semiconductor layer may be formed of amorphous silicon or poly silicon. Here, the poly silicon may be formed by crystallizing the amorphous silicon. The crystallization of the amorphous silicon may be performed by using various methods including a rapid thermal annealing (RTA) method, a solid phase crystallization (SPC) method, an excimer laser annealing (ELA) method, a metal induced crystallization (MIC) method, a metal induced lateral crystallization (MILC) method, a sequential lateral solidification (SLS) method, and the like. However, a method for the semiconductor layer is not limited to the amorphous silicon or the poly silicon and may include an oxide semiconductor.

Figure 3B:
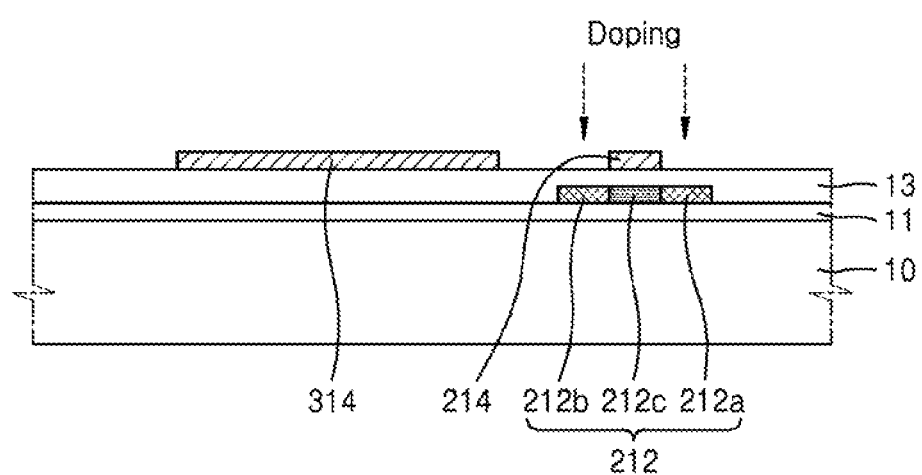

FIG. 3B illustrates a cross-sectional view illustrating a second process for the organic light-emitting diode display apparatus 1, according to an exemplary embodiment of the present invention.

Referring to FIG. 3B, the gate insulating layer 13 is formed on the resultant of the first process shown in FIG. 3A, and a first metal layer (not shown) is formed on the gate insulating layer 13 and is thereafter patterned. The first metal layer is stacked on the gate insulating layer 13 and is thereafter patterned. The first metal layer may be formed as a single layer or multiple layers including at least one metal material including Al, Pt, Pd, Ag, Mg, Au, Ni, Nd, Ir, Cr, Li, Ca, Mo, Ti, W, and/or Cu.

As a patterning result, the gate electrode 214 and the first light reflective layer 314 are formed on the gate insulating layer 13. Therefore, the first light reflective layer 314 may be formed without an additional mask process.

An ion impurity is doped on the aforementioned structure. The ion impurity including b-type ion or p-type ion may be doped, and in more detail, the ion impurity with a density of at least $1 \times 10^{15}$ atoms/cm$^2$ is doped while targeting the active layer 212 of the thin-film transistor.

The active layer 212 is doped with the ion impurity by using the gate electrode 214 as a self-align mask, so that the active layer 212 has the source region 212a and the drain region 212b, and the channel region 212c between the source region 212a and the drain region 212b that are doped with the ion impurity.

Figure 3C:
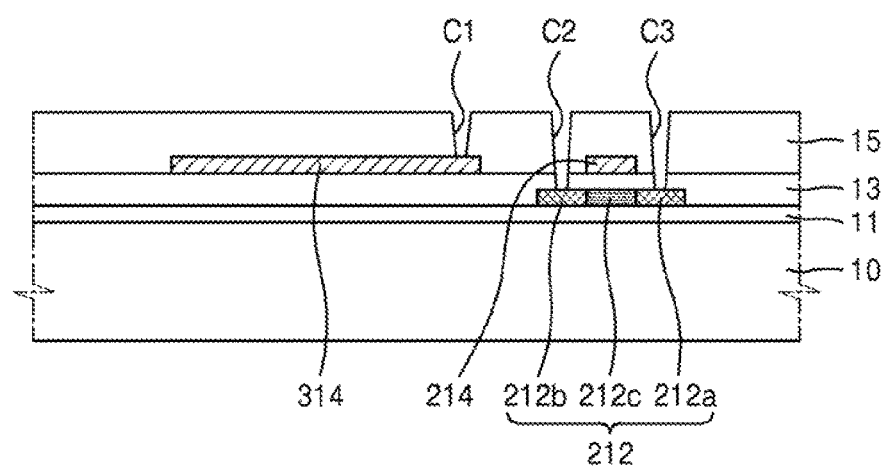

FIG. 3C illustrates a cross-sectional view illustrating a third process for the organic light-emitting diode display apparatus 1, according to exemplary embodiments of the present invention.

Referring to FIG. 3C, the interlayer insulating layer 15 is formed on the resultant of the second process shown in FIG. 3B, and is patterned, so that openings C2 and C3 are formed so as to expose the source region 212a and the drain region 212b of the active layer 212. Also, an opening C1 is formed to expose a portion of the first light reflective layer 314.

The interlayer insulating layer 15 may be formed as a single layer or multiple layers including silicon nitride and/or silicon oxide.

Figure 3D:
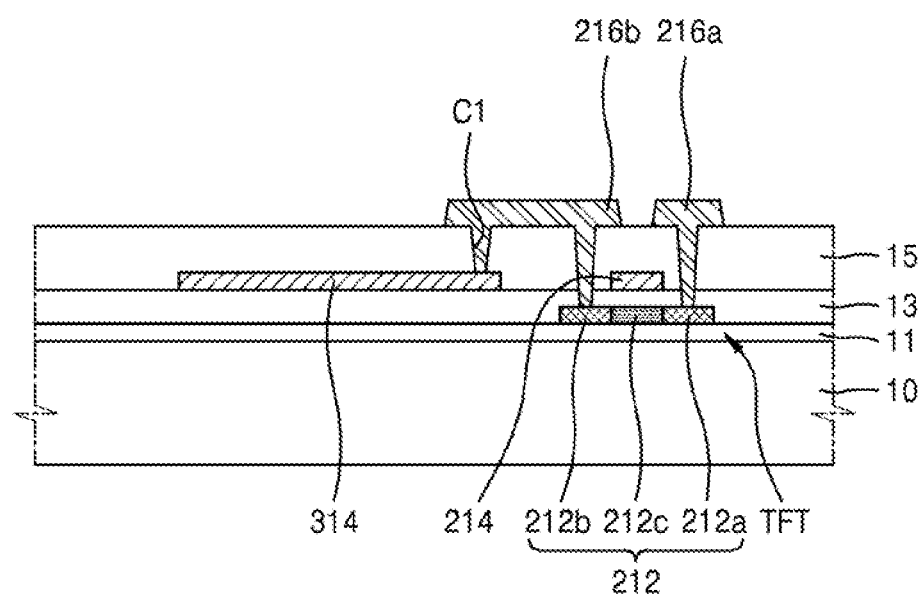

FIG. 3D illustrates a cross-sectional view illustrating a fourth process for the organic light-emitting diode display apparatus 1, according to an exemplary embodiment of the present invention.

Referring to FIG. 3D, a second metal layer (not shown) is formed on the resultant of the third process shown in FIG. 3C and is thereafter patterned. The second metal layer may be formed as a single layer or multiple layers including Al, Pt, Pd, Ag, Mg, Au, Ni, Nd, Ir, Cr, Li, Ca, Mo, Ti, W, and/or Cu.

As a patterning result, the source electrode 216a and the drain electrode 216b that are connected respectively to the source region 212a and the drain region 212b in the gate insulating layer 13 are formed.

The drain electrode 216b is directly connected to the first light reflective layer 314 via the opening C1 formed in the interlayer insulating layer 15. Since the first light reflective layer 314 is directly and electrically connected to a thin-film transistor TFT instead of the first electrode 120, the first light reflective layer 314 is electrically connected to the thin-film transistor TFT and thus forms a complete pixel circuit. Here the TFT is the driving transistor and is directly connected to the first electrode.

Figure 3E:
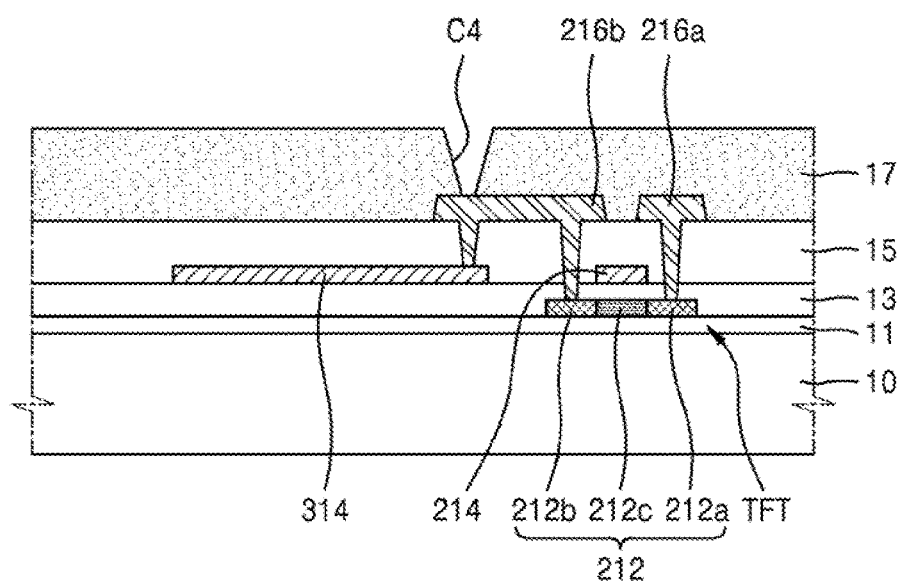

FIG. 3E is a cross-sectional view illustrating a fifth process for the organic light-emitting diode display apparatus 1, according to an exemplary embodiment of the present invention.

Referring to FIG. 3E, the first organic insulating layer 17 is formed on the resultant of the fourth process shown in FIG. 3D, and is patterned thereafter, so that a via hole C4 is formed. The via hole C4 exposes a top surface of the drain electrode 216b that electrically connects the first light reflective layer 314 with the thin-film transistor TFT.

Figure 3F:
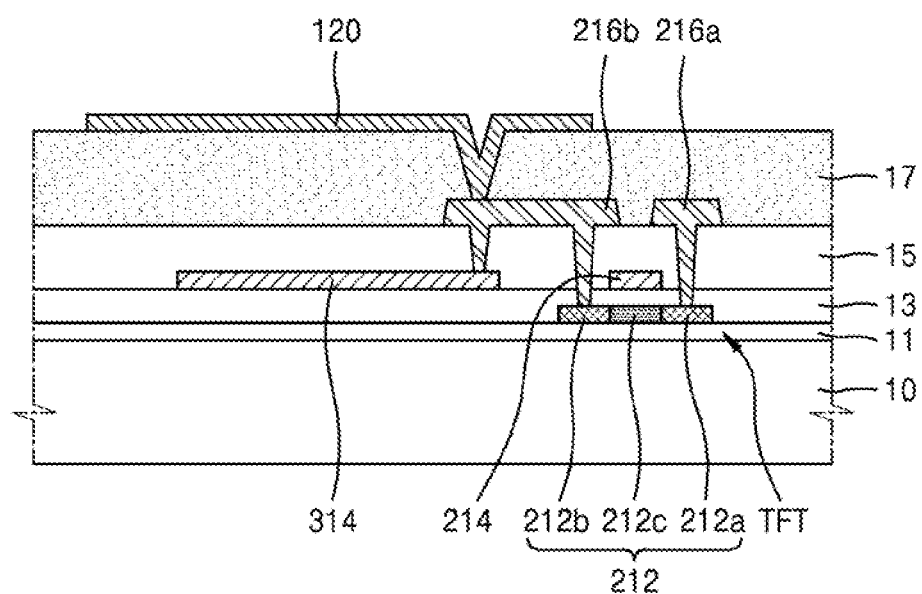

FIG. 3F is a cross-sectional view illustrating a sixth process for the organic light-emitting diode display apparatus 1, according to an exemplary embodiment of the present invention.

Referring to FIG. 3F, a third metal layer (not shown) is formed on the resultant of the fifth process shown in FIG. 3E, and is patterned thereafter, so that the first electrode 120 is formed. The first electrode 120 is connected to the drain electrode 216b through the via hole C4 (refer to FIG. 2) formed in the first organic insulating layer 17.

Since the first electrode 120 functioning as anode is directly and electrically connected to the thin-film transistor TFT that is the driving transistor, in general, when the first electrode 120 is formed, it is possible to perform a TFT array test so as to examine whether a pixel circuit is defective.

Figure 3G:
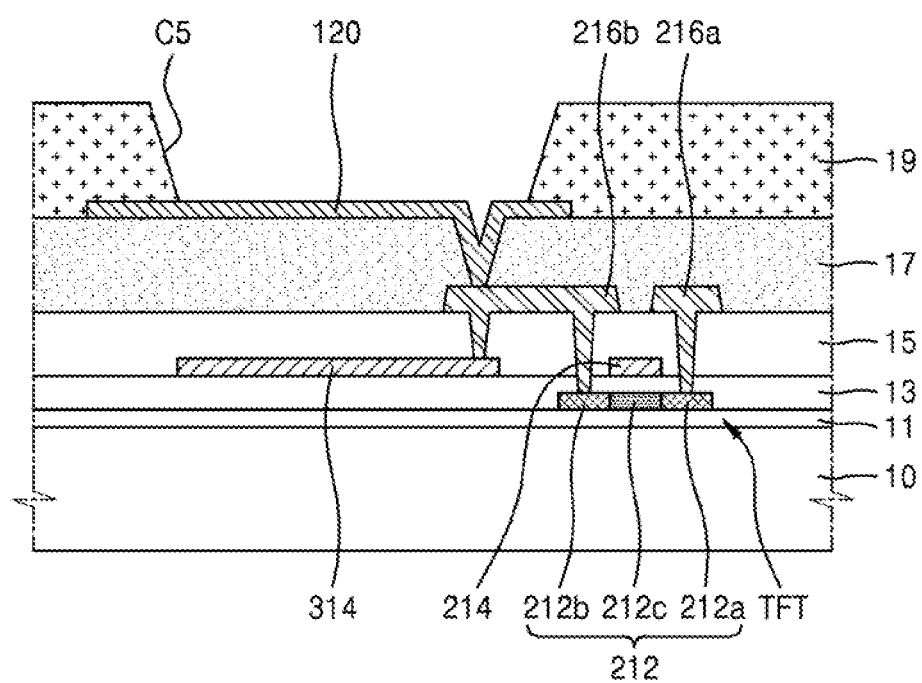

FIG. 3G is a cross-sectional view illustrating a seventh process for the organic light-emitting diode display apparatus 1, according to an exemplary embodiment of the present invention.

Referring to FIG. 3G, the second organic insulating layer 19 is formed on the resultant of the sixth process shown in FIG. 3F, and is patterned thereafter, so that an opening C5 is formed. The opening C5 exposes a top surface of the first electrode 120. Afterward, the second organic insulating layer 19 covers end portions of the first electrode 120 and thus functions as a pixel-defining layer that defines an emission area of a pixel.

The second organic insulating layer 19 may be formed of a material including an acryl-based polymer, an imide-based polymer, an allyl ether-based polymer, an amide-based polymer, a fluorine-based polymer, a p-xylene-based polymer, a vinyl alcohol-based polymer, polymer derivatives having a phenol group, or a combination thereof.

The emission layer 121 (refer to FIG. 2) is formed on the resultant of the seventh process shown in FIG. 3G, and the second electrode 122 is formed on the emission layer 121.

Figure 4:
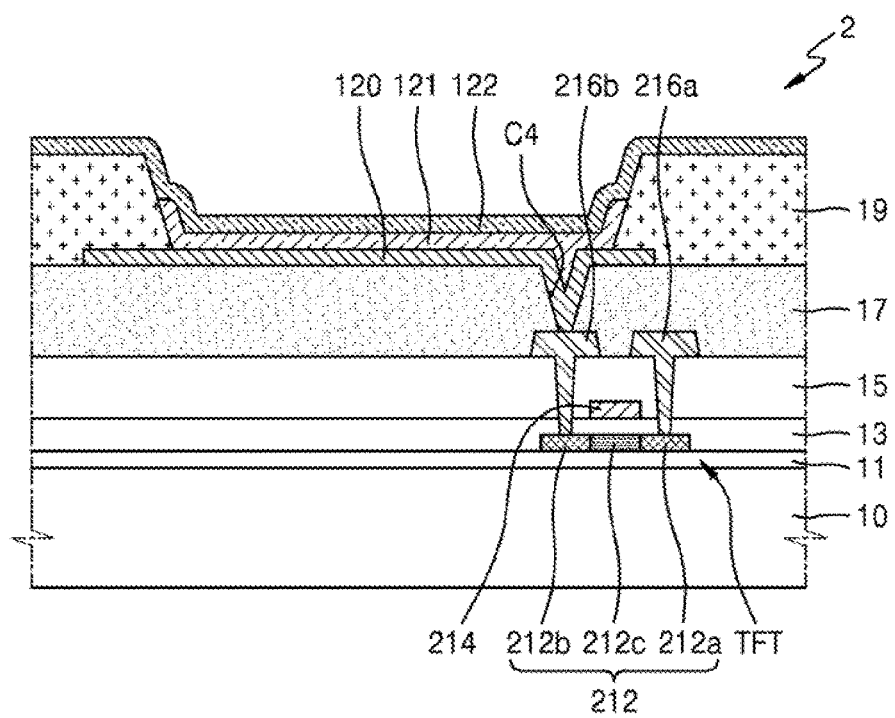
FIG. 4 is a cross-sectional view illustrating an organic light-emitting diode display apparatus according to an exemplary example of the present invention.
Figure 5A:
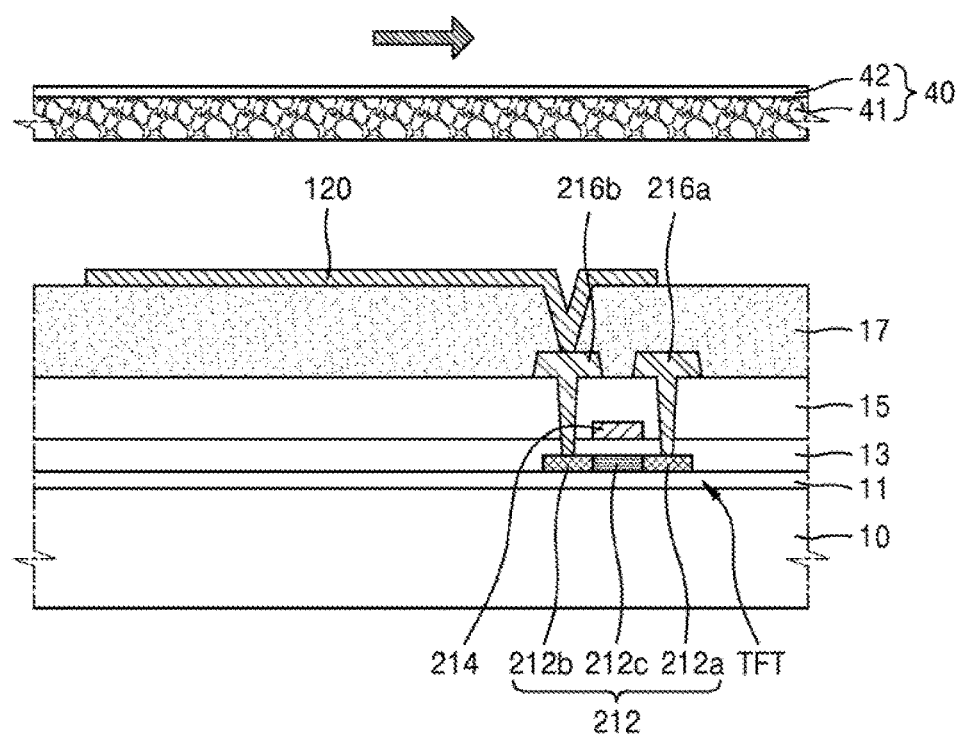
FIGS. 5A and 5B are cross-sectional views illustrating a thin-film transistor (TFT) array test and a repair process with respect to the OLED display apparatus according to an exemplary example of the present invention.
Figure 5B:
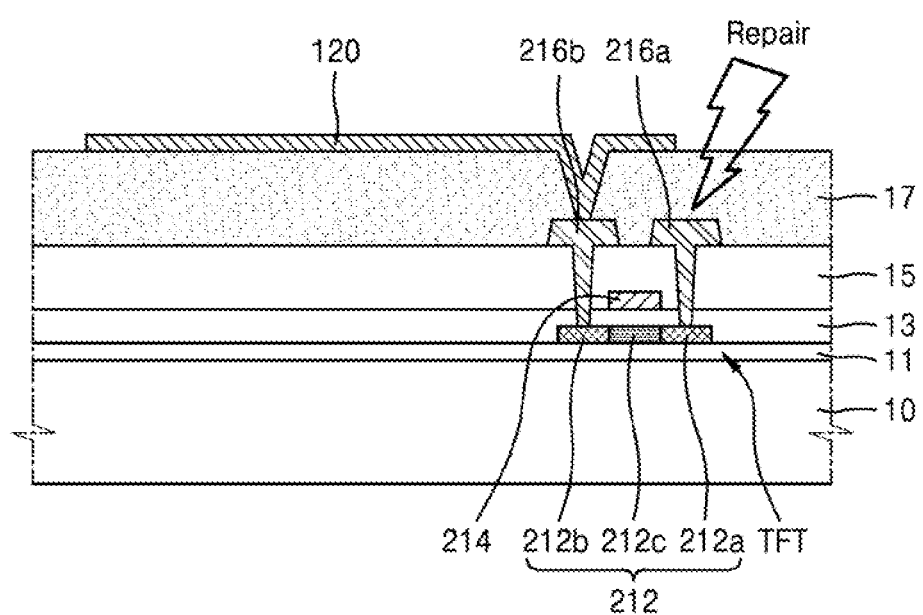

FIG. 4 is a cross-sectional view illustrating an organic light-emitting diode display apparatus 2 according to an exemplary embodiment of the present invention. FIGS. 5A and 5B are cross-sectional views illustrating a TFT array test and a repair process with respect to the organic light-emitting diode display apparatus 2 shown in FIG. 4.

Referring to FIG. 4, the organic light-emitting diode display apparatus 2 according to an exemplary embodiment of the present invention may be substantially the same as the organic light-emitting diode display apparatus 1 previously described, except that the organic light-emitting diode display apparatus 2 need not include the first light reflective layer 314 (refer to FIG. 2). For example, a thin-film transistor TFT is disposed on a substrate 10, and a first electrode 120 formed on a first organic insulating layer 17 is electrically connected to the thin-film transistor TFT through a via hole C4.

Referring to FIG. 5A, when the first electrode 120 is formed, the TFT array test is performed by using an LCD modulator 40.

The LCD modulator 40 includes a liquid crystal layer 41 including liquid crystals, and a common electrode 42.

When an electrical voltage is applied to the first electrode 120 via the thin-film transistor TFT, if the LCD modulator 40 approaches the first electrode 120 at a preset distance therebetween, an electric field is generated between the first electrode 120 and the common electrode 42. When the electric field is generated, a texture of the liquid crystals in the liquid crystal layer 41 is changed according to a value of the electric field. The LCD modulator 40 thereby measures a voltage between the first electrode 120 and the common electrode 42, according to the changed texture. If the LCD modulator 40 detects a voltage value that exceeds a normal range that was previously input to the LCD modulator 40, the LCD modulator 40 may recognize that the thin-film transistor TFT is a defective device.

As described above, when the TFT array test is performed by using the LCD modulator 40 after the first electrode 120 is formed, a defect may be detected before subsequent processing steps are performed. However, even if the organic light-emitting diode display apparatus 2 illustrated in FIG. 4 detects that the thin-film transistor TFT is defective, it may be difficult to repair a defect of the thin-film transistor TFT.

FIG. 5B illustrates a repair process with respect to the organic light-emitting diode display apparatus 2 according to an exemplary embodiment of the present invention.

Referring to FIG. 5B, even if the defect of the thin-film transistor TFT is detected by performing the TFT array test, since the first organic insulating layer 17 including an organic insulating material is formed on the thin-film transistor TFT, it may be difficult to perform the repair process using a laser.

Figure 6A:
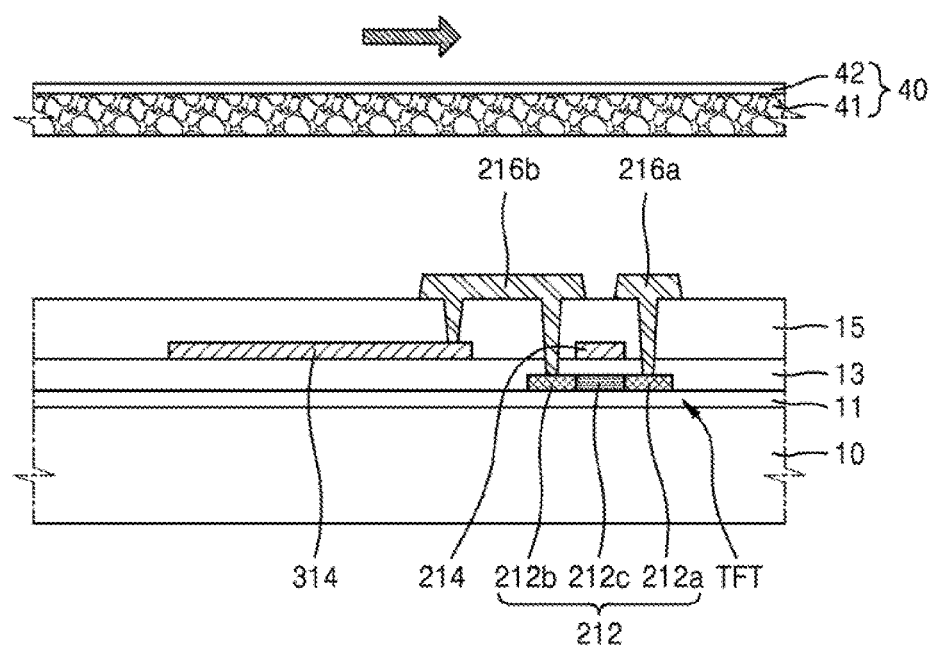
FIGS. 6A and 6B are cross-sectional views illustrating a TFT array test and a repair process with respect to the OLED display apparatus according to an exemplary embodiment of the present invention.
Figure 6B:
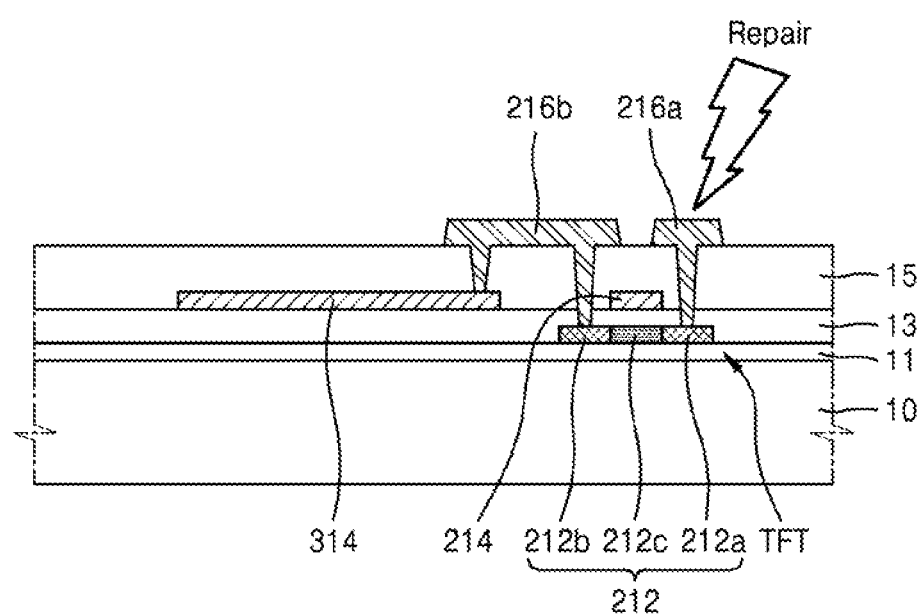

FIGS. 6A and 6B are cross-sectional views illustrating a TFT array test and a repair process with respect to the organic light-emitting diode display apparatus 1 according to an exemplary embodiment of the present invention.

Referring to FIG. 6A, according to an exemplary embodiment of the present invention, in the fourth process (refer to FIG. 3D) in which the source electrode 216a and the drain electrode 216b are formed, the TFT array test may be performed by using an LCD modulator 40.

Before the fourth process, instead of the first electrode 120, the first light reflective layer 314 may already be directly and electrically connected to the thin-film transistor TFT that is the driving transistor, so that a complete pixel circuit is formed. Therefore, a process of forming the first electrode 120 is performed in a different manner from the organic light-emitting diode display apparatus 2 illustrated in FIG. 4, and thus, the TFT array test may be performed by using the LCD modulator 40.

When an electrical voltage is applied to the first light reflective layer 314 via a thin-film transistor TFT, if the LCD modulator 40 approaches the first light reflective layer 314 at a preset distance therebetween, an electric field is generated between the first light reflective layer 314 and a common electrode 42. When the electric field is generated, a texture of liquid crystals included in a liquid crystal layer 41 is changed according to a value of the electric field. The LCD modulator 40 measures a voltage between the first light reflective layer 314 and the common electrode 42, according to the changed texture. If the LCD modulator 40 detects a voltage value that exceeds a normal range that was previously input to the LCD modulator 40, the LCD modulator 40 may recognize that the thin-film transistor TFT is a defective device.

Referring to FIG. 6B, after the source electrode 216a and the drain electrode 216b are formed and the TFT array test is performed, a repair with respect to the thin-film transistor TFT may also be performed.

In the fourth process, the first organic insulating layer 17 is not yet formed, thus, a repair with respect to a defective device may be more easily performed. In particular, a repair with respect to the source electrode 216a and the drain electrode 216b may be more easily performed. Also, when the source electrode 216a and the drain electrode 216b are formed, an on/off error test with respect to the source electrode 216a and the drain electrode 216b may also be performed. During the test, the repair with respect to the source electrode 216a and the drain electrode 216b may be more easily performed. Therefore, a defect rate of the organic light-emitting diode display apparatus 1 may be significantly reduced.

Figure 7:
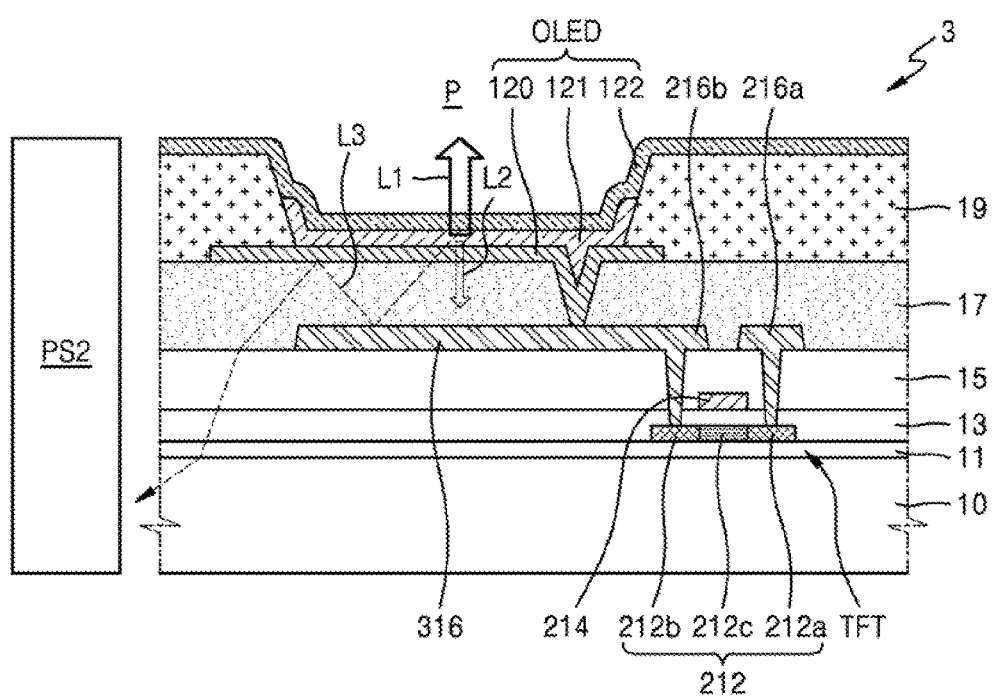
FIG. 7 is a cross-sectional view illustrating portions of a pixel and a photo sensor of an OLED display apparatus according to an exemplary embodiment of the present invention.

FIG. 7 is a cross-sectional view illustrating portions of a pixel and a photo sensor of an organic light-emitting diode display apparatus 3 according to an exemplary embodiment of the present invention.

Hereinafter, the organic light-emitting dipde display apparatus 3 according to an exemplary embodiment of the present invention is described with reference to differences from the organic light-emitting diode display apparatus 1 previously described.

In the organic light-emitting diode display apparatus 3 according to an exemplary embodiment of the present invention, a thin-film transistor TFT, a first light reflective layer 316, and an organic light-emitting device OLED are disposed on a substrate 10, and a photo sensor PS2 is disposed in an outer area of the substrate 10.

Unlike the configuration previously described, the first light reflective layer 316 is formed from the same material layer as a source electrode 216a and a drain electrode 216b. Therefore, the first light reflective layer 316 may be formed without an additional mask process.

The first light reflective layer 316 is formed in such a manner that a portion of the first light reflective layer 316 overlaps with a first electrode 120 in a vertical direction with respect to the substrate 10. An area of the first light reflective layer 316 may be between about 50% and about 100% of an area of the first electrode 120.

The first light reflective layer 316 and the electrode 216 are formed on the same layer and thus are directly connected to each other. Also, the first light reflective layer 316 is directly and electrically connected to the thin-film transistor TFT that is a driving transistor, so that a complete pixel circuit is formed. Therefore, as in the previously-described organic light-emitting diode display apparatus 1, before a process of forming the first electrode 120 is performed, e.g., after the source electrode 216a and the drain electrode 216b are formed and the TFT array test is performed, a repair with respect to the thin-film transistor TFT may also be performed. Therefore, a defect rate of the organic light-emitting diode display apparatus 3 may be significantly reduced.

As the organic light-emitting diose display apparatus 1, as previously described, the organic light-emitting diode display apparatus 3 according to an exemplary embodiment of the present invention is a top emission-type display apparatus in which a reflectance of the first electrode 120 is greater than a reflectance of a second electrode 122, so that various elements may be disposed between the substrate 10 and the organic light-emitting diode OLED device. Therefore, an aperture ratio of the organic light-emitting diode display apparatus 3 may be increased compared to that of a bottom emission-type display apparatus.

A portion of light L2 that is discharged from an emission layer 121 and is emitted toward the substrate 10 is reflected from the first light reflective layer 316, and a portion of reflected light is emitted toward the first electrode 120. The light emitted toward the first electrode 120 is reflected from the first electrode 120 and thus is reflected toward the substrate 10. Light L3 that is a portion of the light reflected toward the substrate 10 and satisfies a total-reflection condition may be guided along the substrate 10 and may reach the photo sensor PS2. In this regard, not only the substrate 10 but also insulating layers such as a buffer layer 11, a gate insulating layer 13, an interlayer insulating layer 15, and the first organic insulating layer 17 that are disposed between the substrate 10 and the first electrode 120 may function as waveguides, and light guided along the insulating layers may reach the photo sensor PS2 therethrough.

Since the organic light-emitting diode display apparatus 3 according to an exemplary embodiment of the present invention includes the first light reflective layer 316, although the organic light-emitting diode display apparatus 3 is the top emission-type display apparatus, the amount of light that reaches the photo sensor PS2 is increased in the organic light-emitting diode display apparatus 3. Therefore, irregular luminance of a pixel P may be corrected, and occurrence of spots may be decreased.

Figure 8:
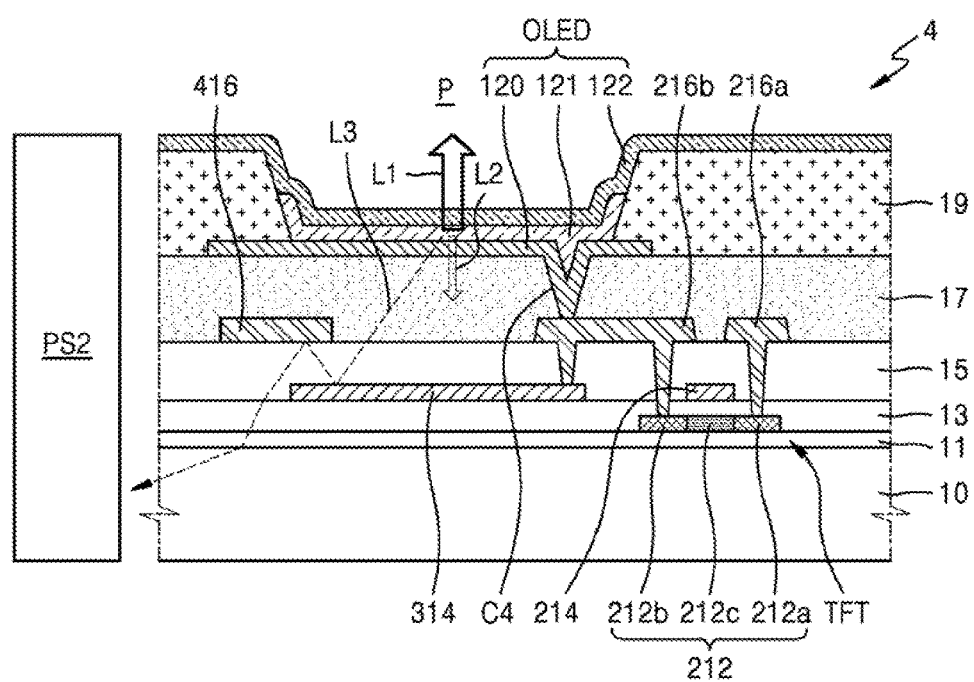
FIG. 8 is a cross-sectional view illustrating portions of a pixel and a photo sensor of an OLED display apparatus according to an exemplary embodiment of the present invention.

FIG. 8 is a cross-sectional view illustrating portions of a pixel and a photo sensor of an organic light-emitting diode display apparatus 4 according to an exemplary embodiment of the present invention.

Hereinafter, the organic light-emitting diode display apparatus 4 according to an exemplary embodiment of the present invention is described with reference to differences from the previously described organic light-emitting diode display apparatus 1.

In the organic light-emitting diode display apparatus 4 according to exemplary embodiments of the present invention, a thin-film transistor TFT, a first light reflective layer 314, a second light reflective layer 416, and an organic light-emitting diode device OLED are disposed on a substrate 10, and a photo sensor PS2 is disposed in an outer area of the substrate 10.

As described above, the first light reflective layer 314 is formed from the same material layer as a gate electrode 214. Therefore, the first light reflective layer 314 may be formed without an additional mask process.

However, unlike the approach described above, the organic light-emitting diode display apparatus 4 according to an exemplary embodiment of the present invention includes the second light reflective layer 416 disposed between the first light reflective layer 314 and a first electrode 120.

The second light reflective layer 416 is formed from the same material layer as a source electrode 216*a* and a drain electrode 216*b*. Therefore, the second light reflective layer 416 may be formed without an additional mask process.

The first light reflective layer 314 is directly and electrically connected to the thin-film transistor TFT that is a driving transistor. The second light reflective layer 416 may electrically float with respect to the first electrode 120 and the thin-film transistor TFT.

The first light reflective layer 314 is formed such that a portion of the first light reflective layer 314 overlaps with the first electrode 120 in a vertical direction with respect to the substrate 10. An area of the first light reflective layer 314 may be between about 50% and about 100% of an area of the first electrode 120.

The second light reflective layer 416 is formed such that a portion of the second light reflective layer 416 overlaps with the first electrode 120 in a vertical direction with respect to the substrate 10. However, an area of the second light reflective layer 416 may be less than the area of the first light reflective layer 314.

The first light reflective layer 314 that is directly connected to the drain electrode 216*b* through a via hole C4 formed in an interlayer insulating layer 17 is directly and electrically connected to the thin-film transistor TFT that is the driving transistor. Accordingly, a complete pixel circuit is formed. As in the previously-described organic light-emitting diode display apparatus 1, before a process of forming the first electrode 120 is performed, e.g., after the source electrode 216*a* and the drain electrode 216*b* are formed and the TFT array test is performed, a repair with respect to the thin-film transistor TFT may also be performed. Therefore, a defect rate of the organic light-emitting diode display apparatus 4 may be significantly reduced.

As the previously-described organic light-emitting diode display apparatus 1 is a top emission-type display apparatus in which a reflectance of the first electrode 120 is greater than a reflectance of a second electrode 122, that various elements may be disposed between the substrate 10 and the organic light-emitting diose device OLED. Therefore, an aperture ratio of the organic light-emitting diode display apparatus 4 may be increased compared to that of a bottom emission-type display apparatus.

In addition, the organic light-emitting diode display apparatus 4 according to an exemplary embodiment of the present invention further includes the second light reflective layer 416, so that the amount of light that reaches the photo sensor PS2 may be further increased.

A portion of light that is discharged from an emission layer 121 and is emitted toward the substrate 10 is reflected from the first light reflective layer 314. A portion of reflected light is reflected toward the first electrode 120 and light L3 that is a portion of the reflected light is reflected toward the second light reflective layer 416.

The light L3 emitted toward the second light reflective layer 416 is reflected from the second light reflective layer 416 and thus is reflected again toward the substrate 10. The light L3 that is reflected toward the substrate 10 and satisfies a total-reflection condition may be guided along the substrate 10 and may reach the photo sensor PS2. As described above, the light that is reflected from the first light reflective layer 314 and then is reflected toward the first electrode 120 is reflected from the first electrode 120 and thus is reflected again toward the substrate 10. Therefore, compared to the previously described approach, a greater amount of light may reach the photo sensor PS2.

Figure 9:
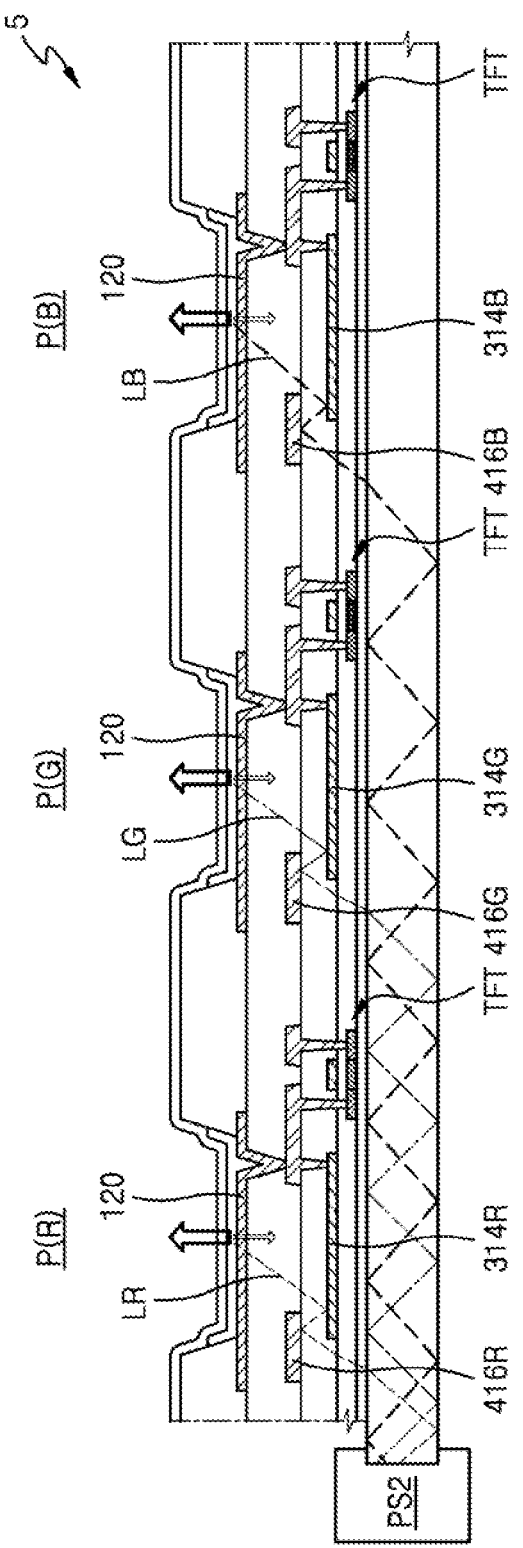
FIG. 9 is a cross-sectional view illustrating portions of a pixel and a photo sensor of an OLED display apparatus according to an exemplary embodiment of the present invention.

FIG. 9 illustrates a cross-sectional view illustrating portions of a pixel and a photo sensor of an organic light-emitting diode display apparatus 5 according to an exemplary embodiment of the present invention.

Hereinafter, the organic light-emitting diode display apparatus 5 according to an exemplary embodiment of the present invention is described with reference to differences from the organic light-emitting diode display apparatus 4.

The organic light-emitting diode display apparatus 5 includes a plurality of first through third pixels P(R), P(G), and P(B) disposed on a substrate 10.

The first through third pixels P(R), P(G), and P(B) may emit light of different colors. For example, the first pixel P(R) may emit red light, the second pixel P(G) may emit green light, and the third pixel P(B) may emit blue light. When lights emitted from the first through third pixels P(R), P(G), and P(B) are mixed, white light is generated. Each of the first through third pixels P(R), P(G), and P(B) may be a sub-pixel that is part of a unit pixel.

A photo sensor PS2 is disposed in an outer area of the first through third pixels P(R), P(G), and P(B). The photo sensor PS2 may include a plurality of sensing devices (not shown) capable of sensing lights having different colors, respectively.

The first pixel P(R) may include a thin-film transistor TFT, a first light reflective layer 314R, a second light reflective layer 416R, and an organic light-emitting diode device OLED, the second pixel P(G) may include a thin-film transistor TFT, a first light reflective layer 314G, a second light reflective layer 416G, and an organic light-emitting diode device OLED, and the third pixel P(B) may include a thin-film transistor TFT, a first light reflective layer 314B, a second light reflective layer 416B, and an organic light-emitting diode (OLED) display device.

The first light reflective layers 314R, 314G, and 314B of the first through third pixels P(R), P(G), and P(B) are respectively, directly and electrically connected to the thin-film transistors TFT, which are driving transistors. The second light reflective layer 416R, 416G, and 416B electrically float with respect to first electrodes 120 and the thin-film transistors TFT of the first through third pixels P(R), P(G), and P(B).

A portion of light emitted from the first pixel P(R) is reflected from the first light reflective layer 314R, and a portion LR of reflected light is reflected toward the second light reflective layer 416R. The light LR reflected toward the second light reflective layer 416R is reflected from the second light reflective layer 416R and thus is reflected again to the substrate 10. The light LR that is reflected toward the substrate 10 and satisfies a total-reflection condition may be guided along the substrate 10 and may reach the photo sensor PS2. A first photo sensor (not shown) included in the photo sensor PS2 senses red light emitted from the first pixel P(R).

A portion of light emitted from the second pixel P(G) is reflected from the first light reflective layer 314G, and a portion LG of reflected light is reflected toward the second light reflective layer 416G. The light LG reflected toward the second light reflective layer 416G is reflected from the second light reflective layer 416G and thus is reflected again to the substrate 10. The light LG that is reflected toward the substrate 10 and satisfies a total-reflection condition may be guided along the substrate 10 and may reach the photo sensor PS2. A second photo sensor (not shown) included in the photo sensor PS2 senses green light emitted from the second pixel P(G).

A portion of light emitted from the third pixel P(B) is reflected from the first light reflective layer 314B, and a portion LB of reflected light is reflected toward the second light reflective layer 416B. The light LB reflected toward the second light reflective layer 416B is reflected from the second light reflective layer 416B and thus is reflected again to the substrate 10. The light LB that is reflected toward the substrate 10 and satisfies a total-reflection condition may be guided along the substrate 10 and may reach the photo sensor PS2. A third photo sensor (not shown) included in the photo sensor PS2 senses blue light emitted from the third pixel P(B).

Since the organic light-emitting diode display apparatus 5 according to an exemplary embodiment of the present invention includes the plurality of sensing devices (not shown) capable of sensing lights having different colors, respectively, irregular luminance of a pixel of the organic light-emitting diode display apparatus 5 that is a full color organic light-emitting diode display apparatus may be corrected, and thus occurrence of spots may be decreased.

The organic light-emitting diode display apparatus according to exemplary embodiments of the present invention is a top emission-type display apparatus, and thus may have a greater aperture ratio than that of a bottom emission-type display apparatus.

When the TFT array test with respect to the organic light-emitting diode display apparatus according to exemplary embodiments of the present invention is performed, a repair with respect to the thin-film transistor may also be performed, thus, a defect of the organic light-emitting diode display apparatus may be significantly reduced.

In the organic light-emitting diode display apparatus according to exemplary embodiments of the present invention, at least one photo sensor is disposed in an outer area of a display area, and a light reflective layer is formed between a pixel electrode and a substrate. Therefore, although the organic light-emitting diode display apparatus is a top emission-type display apparatus, the amount of light that reaches the photo sensor is increased so that the efficiency of the photo sensor may be increased.

It should be understood that exemplary embodiments of the present invention described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope of the present invention.

What is claimed is:

1. An organic light-emitting diode display apparatus comprising:
    a substrate;
    an organic light-emitting device disposed on the substrate and comprising a first electrode, a second electrode, and an emission layer disposed between the first electrode and the second electrode, wherein a reflectance of the first electrode is greater than a reflectance of the second electrode;
    a thin-film transistor disposed between the substrate and the first electrode, the thin-film transistor being connected to the first electrode;

a first light reflective layer disposed between the substrate and the first electrode, the first light reflective layer being connected to the thin-film transistor; and a photo sensor disposed in an outer area of the substrate and configured to sense light reflected from the first light reflective layer.

2. The organic light-emitting diode display apparatus of claim 1, wherein the first light reflective layer overlaps the first electrode in a vertical direction with respect to the substrate.

3. The organic light-emitting diode display apparatus of claim 1, wherein an area of the first light reflective layer is between about 50% and about 100% of an area of the first electrode.

4. The organic light-emitting diode display apparatus of claim 1, wherein the thin-film transistor comprises an active layer, a gate electrode, a source electrode, and a drain electrode, and the first light reflective layer is disposed on a same layer as the gate electrode.

5. The organic light-emitting diode display apparatus of claim 4, wherein the first light reflective layer comprises a same material as the gate electrode.

6. The organic light-emitting diode display apparatus of claim 4, wherein an organic insulating layer is disposed between the source electrode and the first electrode and is disposed between the drain electrode and the first electrode, and the first electrode directly contacts either the source electrode or the drain electrode through a via hole formed in the organic insulating layer.

7. The organic light-emitting diode display apparatus of claim 1, wherein the thin-film transistor comprises an active layer, a gate electrode, a source electrode, and a drain electrode, and the first light reflective layer is disposed on a same layer as the source electrode and the drain electrode.

8. The organic light-emitting diode display apparatus of claim 7, wherein the first light reflective layer comprises a same material as each of the source electrode and the drain electrode.

9. The organic light-emitting diode display apparatus of claim 7, wherein an organic insulating layer is disposed between the source electrode and the first electrode, between the drain electrode and the first electrode, and between the first light reflective layer and the first electrode, and the first electrode directly contacts the source electrode or the drain electrode through a via hole formed in the organic insulating layer.

10. The organic light-emitting diode display apparatus of claim 1, further comprising a second light reflective layer disposed between the first light reflective layer and the first electrode.

11. The organic light-emitting diode display apparatus of claim 10, wherein the thin-film transistor comprises an active layer, a gate electrode, a source electrode, and a drain electrode, the first light reflective layer is disposed on a same layer as the gate electrode, and the second light reflective layer is disposed on a same layer as the source electrode and the drain electrode.

12. The organic light-emitting diode display apparatus of claim 10, wherein the first light reflective layer comprises a same material as the gate electrode, and the second light reflective layer comprises a same material as each of the source electrode and the drain electrode.

13. The organic light-emitting diode display apparatus of claim 10, wherein an organic insulating layer is disposed between the source electrode and the first electrode, between the drain electrode and the first electrode, and between the second light reflective layer and the first electrode, and the first electrode directly contacts the source electrode or the drain electrode thorough a via hole formed in the organic insulating layer.

14. The organic light-emitting diode display apparatus of claim 10, wherein the second light reflective layer electrically floats with respect to the first electrode and the thin-film transistor.

15. The organic light-emitting diode display apparatus of claim 10, wherein the second light reflective layer overlaps the first electrode in a vertical direction with respect to the substrate.

16. The organic light-emitting diode display apparatus of claim 15, wherein an area of the second light reflective layer is less than an area of the first light reflective layer.

17. The organic light-emitting diode display apparatus of claim 1, wherein the first electrode comprises silver (Ag) or a silver alloy.

18. An organic light-emitting diode display apparatus comprising a display area disposed on a substrate, the organic light-emitting diode display apparatus comprising:

a plurality of pixels disposed on the display area, wherein each of the plurality of pixels comprises:

a first electrode, a second electrode having a reflectance less than a reflectance of the first electrode, and an emission layer between the first electrode and the second electrode;

a driving thin-film transistor disposed between the substrate and the first electrode, and connected to the first electrode; and a first light reflective layer connected to the driving thin-film transistor, the thin-film transistor being disposed between the substrate and the first electrode and connected to the first electrode, and wherein the organic light-emitting diode display apparatus further comprises a photo sensor that is disposed in an outer area of the display area and is configured to sense light reflected from a plurality of the first light reflective layers disposed in the plurality of pixels.

19. The organic light-emitting diode display apparatus of claim 18, wherein each of the plurality of pixels emits light of a different color, and the photo sensor comprises a plurality of photo devices configured to sense the light of the different colors.

20. The organic light-emitting diode display apparatus of claim 19, wherein, white light is generated when the respective light of different colors emitted from the plurality of pixels are mixed.

21. The organic light-emitting diode display apparatus of claim 18, wherein the photo sensor is disposed at a side end of the substrate.

* * * * *